United States Patent [19]
Jankowski

[11] Patent Number: 5,262,658
[45] Date of Patent: * Nov. 16, 1993

[54] THERMALLY STABILIZED LIGHT EMITTING DIODE STRUCTURE

[75] Inventor: Henry P. Jankowski, Rochester, N.Y.

[73] Assignee: Xerox Corporation, Stamford, Conn.

[*] Notice: The portion of the term of this patent subsequent to Aug. 18, 2009 has been disclaimed.

[21] Appl. No.: 813,174

[22] Filed: Dec. 24, 1991

[51] Int. Cl.⁵ .................................. H01L 33/00
[52] U.S. Cl. ............................... 257/88; 257/94; 257/467; 372/50; 372/46
[58] Field of Search ............ 257/88, 94, 717, 467; 372/34, 36, 45, 46, 50

[56] References Cited

U.S. PATENT DOCUMENTS

| | | | |
|---|---|---|---|
| 4,542,512 | 9/1985 | Van Den Beemt | 372/36 |
| 4,831,629 | 5/1989 | Paoli et al. | 372/50 |
| 4,980,893 | 12/1990 | Thornton et al. | 372/46 |
| 5,140,605 | 8/1992 | Paoli et al. | 372/46 |
| 5,150,371 | 9/1992 | Abramov et al. | 372/36 |
| 5,173,909 | 12/1992 | Sakano et al. | 372/36 |

FOREIGN PATENT DOCUMENTS

| | | | |
|---|---|---|---|
| 2-65184 | 3/1990 | Japan | 257/88 |
| 2-138785 | 5/1990 | Japan | 372/36 |
| 3-104288 | 5/1991 | Japan | 257/88 |

*Primary Examiner*—Rolf Hille
*Assistant Examiner*—Minh Loan Tran
*Attorney, Agent, or Firm*—William Propp

[57] ABSTRACT

A light emitting diode structure is thermally stabilized by passing current through heater elements along the sides of the light emitting diode. A heater element is adjacent to and corresponding to each light emitting diode. The heater elements may be a resistive region or a p-n junction. The heater elements may be adjacent along one side of the light emitting diodes or on alternating sides of the individual light emitting diodes. The heater elements may be a single heater strip adjacent and along the length of the array of the light emitting diodes.

9 Claims, 3 Drawing Sheets

THERMALLY STABILIZED LIGHT EMITTING DIODE STRUCTURE

BACKGROUND OF THE INVENTION

This invention relates to an array of light emitting diodes (LEDs), and, more particularly, to a light emitting diode array structure that has been thermally stabilized by passing currents through heater strips adjacent to the light emitting diodes.

The ability to fabricate closely spaced, or high density, independently addressable light emitting diode sources is important for many applications such as optical disk technology, laser printing and scanning, optical interconnection and fiber optic communications.

Individually, semiconductor light emitting diodes are low power output devices. Arrays of semiconductor light emitting diodes can be used to increase the power output and to simplify optical system design. To provide and maintain good optical alignment of the light emitting elements of the array with one another and to minimize the assembly involved, arrays have been fabricated so that the light emitting elements are in a single semiconductor substrate.

One problem with such arrays is maintaining the electrical and optical isolation between the individual light emitting elements. Another problem is increasing the density of the light emitting elements in the substrate by closely spacing the elements together while still maintaining the isolation, avoiding heat dissipation problems, and providing precise alignment of the elements and the resulting emitted light.

Light emitting diodes are typically arranged in an array with each individual surface emitter light emitting diode producing an individual exposed pixel on a photoreceptor. The individual light emitting diodes in the array are turned on or not turned on in response to a signal corresponding to a digital image.

Typical light emitting diode pixel times for high speed printers are on the order of 10 to 100 nanoseconds. When the light emitting diode is turned on, adiabatic heating of the light emitting diode light emitting areas occurs due to the inefficiency of the conversion of electrical energy into emitted light. The heat dissipates over time periods on the order of 10 to 100 microseconds. This difference in time constants will cause the temperature of the typical light emitting diode light emitting areas to vary with the pattern of the data being written.

Because of the variety of images to be formed with the array of light emitting diode pixels, certain of the light emitting diodes will be operated significantly more than the average while certain other of the light emitting diodes will be operated seldom, if at all, in the short term. This quasi-random mode of operation or duty cycle will vary the degrees of heating for the individual light emitting diodes in the array causing nonuniform temperature induced expansion of sections of the light emitting diode array. These expansions of sections of the light emitting diode array will result in varying the positioning of the light emitted from the array thus varying the pixel positioning on the photoreceptor, losing placement of the pixels, degradation of the image quality, and causing registration errors, especially in the next generation of color printers.

Typical prior art light emitting diode structures may use a heat sink to remove heat from the light emitting diode structure during light emission. The heat sink temperature is maintained at a constant level by using a Peltier or thermoelectric cooler. Because of the thermal resistance between the light emitting diode light emitting areas and the heat sink, this technique is not capable of maintaining the light emitting diode cavity at a constant transient temperature. The heat sink helps maintain an average temperature within the light emitting diode light emitting area. The light emitting diode pixel times for high speed printers occur too fast and over too short periods of time for the heat sink or Peltier or thermo-electric cooler to respond to, thus resulting in temperature fluctuations from pulse to pulse within the light emitting diode light emitting area.

It is an object of this invention to provide a novel means to stabilize the temperature of a light emitting diode array and thus to stabilize the pixel positioning from that light emitting diode array.

It is another object of this invention to provide a means to stabilize the temperature of a light emitting diode in an array at the hotter, higher temperature at which the light emitting diode is emitting light, even when the light emitting diode is not emitting light.

It is another object of this invention to provide a means to stabilize the temperature of a light emitting diode at a constant transient temperature and to stabilize the temperature of a light emitting diode from pulse to pulse.

SUMMARY OF THE INVENTION

In accordance with the present invention, a light emitting diode structure is thermally stabilized by passing current through heater elements along the sides of the light emitting diode. A heater element is adjacent to and corresponding to each light emitting diode. The heater elements may be a resistive region or a p-n junction. The heater elements may be adjacent along one side of the light emitting diodes or on alternating sides of the individual light emitting diodes. The heater elements may be a single heater strip adjacent and along the length of the array of the light emitting diodes.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
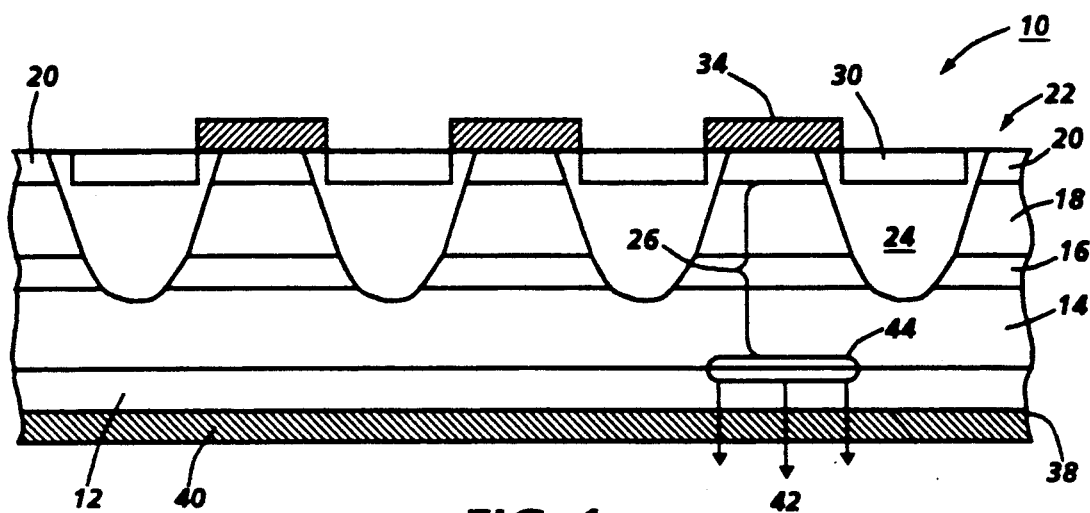
FIG. 1 is a schematic illustration of the side view of the thermally stabilized light emitting diode array-structure formed according to the present invention.

Reference is now made to FIG. 1, wherein there is illustrated a thermally stabilized light emitting diode array structure 10 of this invention.

The thermally stabilized light emitting diode array structure 10 comprises a substrate 12 of n-GaAs upon which is epitaxially deposited a first confinement layer 14 of n-$Al_xGa_{1-x}As$; an active layer 16 of nondoped GaAs for providing light wave generation and propagation, a second confinement layer 18 of p-$Al_yGa_{1-y}As$ where x= or $\neq$y, and a contact layer 20 of p-GaAs. The bandgap of the semiconductor material of the active layer 16 should be less than that of the first confinement layer 14 so that the first confinement layer is transparent to the light generated in the active layer. The first confinement layer should also have a doping level as low as possible without introducing unnecessary resistance so that the first confinement layer is transparent to the light generated in the active layer. The substrate, on the other hand, should be heavily doped to increase electrical conductivity.

Since the first confinement layer 14 and the substrate 12 are both n-type conductivity, that side of the LED array from the active layer is referred to as the n-side of the LED array. Similarly, since the second confinement layer 18 and the contact layer 20 are both p-type conductivity, that side of the LED array from the active layer is referred to as the p-side of the LED array.

The active layer 16 may, in the alternative, be nondoped or p-type doped or n-type doped; GaAs, $Al_zGa_{1-z}As$ or $(Al_zGa_{1-z})_{0.5}In_{0.5}P$; or a relatively thin conventional double heterostructure (DH) active layer; or a single quantum well, such as GaAs or $Al_zGa_{1-z}As$ where z is very small and z<x and y; or a multiple quantum well superlattice, such as alternating layers of GaAs and $Al_zGa_{1-z}As$ where z<x and y or alternating layers of $Al_wGa_{1-w}As$ and $Al_BGa_{1-B}As$ where w<B<x or y (w for well and B for barrier). Also, in the alternative, any of the aforementioned active layers can be deposited between two semiconductor confinement layers of $Al_mGa_{1-m}As$ and $Al_nGa_{1-n}As$, where m= or $\neq$n, but with the bandgaps intermediate between the bandgaps of the active layer and the first and second confinement layers, in a separate confinement structure.

As is known in the art, the epitaxial growth of thermally stabilized light emitting diode array structure 10 may be carried out by molecular beam epitaxy (MBE) or metalorganic chemical vapor deposition (MOCVD). The substrate 12 may be about 100 microns thick. The confinement layers 14 and 18 may have a thickness in the range of 0.1 to 1 micron. The active layer 16 may be a thin conventional layer having a thickness of 50 nanometers to 2 microns or may be comprised of a superlattice structure of quantum wells which may be 3 to 50 nanometers thick. The contact layer 20 is typically 0.1 to 0.2 microns thick.

There are alternate conventional techniques and diffusion/implant species for carrying out the desired disordering or the elemental implant/annealing technique. Discussion hereafter will be confined to impurity induced disordering. However, it should be noted that these other techniques and elemental diffusions or implants are equally applicable.

Upon completion of the epitaxial growth, a $Si_3N_4$ mask is formed on the top surface 22 of the contact layer 20 of the semiconductor light emitting diode array structure 10 with openings exposing regions of the semiconductor structure to impurity induced disordering. The mask protects the unexposed regions which will form and shape the light emitting diode light emitting areas which can be circular, elliptical, square, parallelogramal, trapezoidal, triangular or any desired shape or size.

The light emitting areas are established by first selectively diffusing a high concentration n-impurity dopant, such as silicon, into the regions of the semiconductor structure exposed through the mask. Other n-impurity dopant elements would include Ge and Sn.

A silicon layer is deposited in the opening in the $Si_3N_4$ mask and then capped with an additional layer of $Si_3N_4$. The diffusion of silicon is accomplished at a temperature of approximately 800° C. and is maintained for a sufficiently long period of time, e.g. seven to eight hours, to penetrate the contact layer 20, the second confinement layer 18 and the active layer 16, and partially penetrate the first confinement layer 14.

The diffusion of silicon through and into the active layer 16, the contact layer 20 and the confinement layers 14 and 18 causes an intermixing of Ga and Al in the active layer 16, the contact layer 20 and the confinement layers 14 and 18, thereby forming a n-impurity induced disordered region 24.

Between the disordered regions 24 in the semiconductor light emitting diode array are the light emitting diode light emitting areas 26 consisting of the nondisordered sections of the second confinement layer 18, the active layer 16 and the first confinement layer 14. The disordered regions, optically and electrically, isolate and separate the light emitting areas of the light emitting diode. The light emitting areas are shaped by the confinement layers in the vertical direction and the shape of the disordered regions in the horizontal direction.

Figure 2:
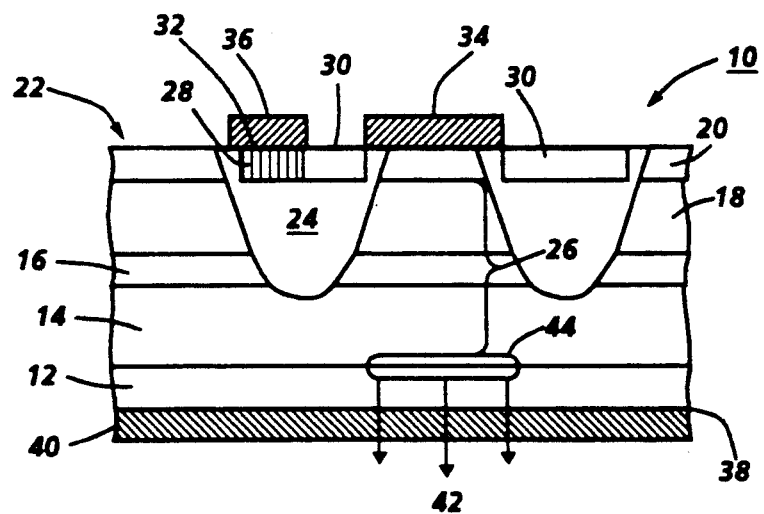
FIG. 2 is a schematic illustration of a cross-sectional side view of the thermally stabilized light emitting diode array structure of FIG. 1.
Figure 3:
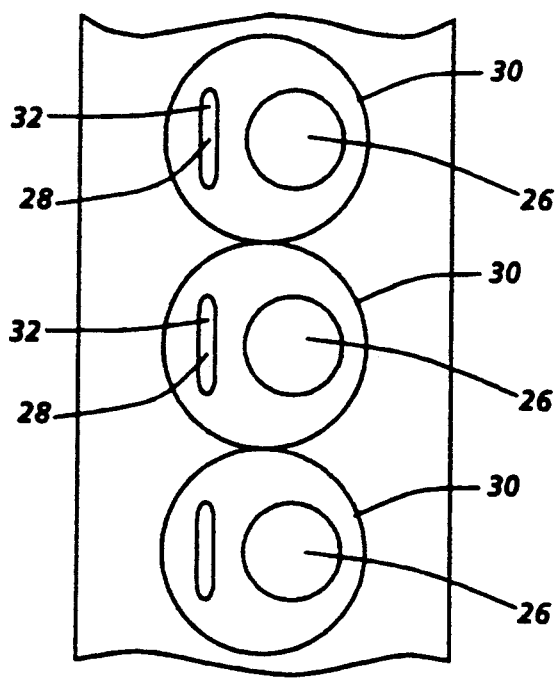
FIG. 3 is a schematic illustration of the top view of the thermally stabilized light emitting diode array structure of FIG. 1.

As best seen in the cross-sectional view of FIG. 2 and the top view of FIG. 3, upon completion of the impurity induced disordering steps, individual shallow resistive regions 28 are formed in the disordered regions 24 adjacent to and parallel to the individual light emitting diode light emitting areas 26 of the array, one individual resistive region 28 corresponding to each individual light emitting diode 26. These shallow resistive regions 28 are formed by implantation of He+ or O+ ions through the top surface 22. The resistive region is made by converting a portion of the top layers or layers of the semiconductor structure from conducting material to highly resistive material. This conversion can be accomplished by implanting He+ or O+ ions through the surface to form electronic states at energies in the bandgap of the semiconductor layers. These defect states remove electrons or holes from the doped layer thereby making it resistive.

The resistive region implantation can be made through a second mask or through a portion of the same mask openings as used for the silicon diffusion after the silicon diffusion has been performed and the openings have been reopened. It is also possible, but less desirable, to form the resistive region by depositing a resistive material on the surface of the contact layer. The individual resistive regions 28 form an array adjacent and parallel to the light emitting diode array, one individual resistive region corresponding to each individual light emitting diode, as such the regions can not be seen in the side view of FIG. 1 but can be viewed in the side view of FIG. 2 and the top view of FIG. 3.

As seen in FIGS. 1, 2 and 3, electrically isolating strips 30 are formed in the disordered regions 24 by proton (He+) or O+ ion implantation through the top surface 22 to isolate portions of the resistive regions 28 as heater elements 32. The electrically isolating strips 30 are formed by implanting the He+ or O+ ions deep into the disordered regions 24 surrounding the LED light emitting areas 26.

The electrically isolating strips 30 are formed surrounding the light emitting diode 26 and between the light emitting diode light emitting area and the resistive regions by masking the resistive region and the light emitting diodes 26 against the deep implant. After this implant, the strips 30 provide electrical isolation between the light emitting diode and heater contacts which will be formed on the top surface 22 of the contact layer 20.

The technique for forming the resistive region is the same as that used conventionally to form the electrically isolating region in a light emitting diode by proton (He+) bombardment. The difference is that the depth and dosage of the resistive region implant is controlled to produce a specific resistivity which is less than the resistivity of an implant done for electrical isolation. Typically the resistive region implant will have a few kohms of resistance while the isolation implant will have many megohms of resistance or more. Thus, the resistive region implant will be shallower and/or have a lower dosage of ions at a lower energy than the isolating region implant.

Standard masking means or other techniques are employed to form metal contacts of Cr-Au or Ti-Pt-Au on the top surface 22 of the contact layer 20. These metal contacts are used as light emitting diode contacts or heater contacts.

As shown in FIGS. 1 and 2, light emitting diode contacts 34 are aligned with each light emitting diode light emitting area 26. The light emitting diode contacts extend on the top surface 22 across the nondisordered section of the contact layer 20 and across the adjacent disordered regions 24 on both sides of the nondisordered section and partially extend across the adjacent electrically isolating region 30 on both sides. Each light emitting diode contact separately, independently, and individually contacts a light emitting diode light emitting area.

Heater contacts 36 are aligned with each heater element 32, as shown in FIG. 2. The heater contacts extend on the top surface 22 across the heater element 32 and partially extends across the adjacent electrically isolating region 30 on both sides. Each heater contact separately, independently, and individually contacts a heater element.

The electrically isolating regions 30 have light emitting diode contacts 34 and heater contacts 36 partially extending along their top surface 22 but the light emitting diode contacts and heater contacts are electrically and physically isolated from each other.

Each contact, either light emitting diode or heater, is shaped by shaping the hole in a metallization mask. Both contacts can be formed simultaneously in one evaporation.

The nondisordered contact layer 20 beneath each light emitting diode contact 34 provides low electrical resistance to the aligned light emitting diode light emitting area 26. The heater contact 36 is directly attached to the heater element 32 to allow current to be directly passed through the heater.

A portion of the bottom surface 38 of the substrate 12 is also metallized with Au/Ge to form a substrate contact 40. A portion of the bottom surface, aligned with the light emitting diodes, is not metallized to permit the transmission of light emitted from the light emitting diodes. The substrate contact is for both heater and light emitting diode contacts and can be referenced to ground.

Current is injected between the light emitting diode contact 34 and the substrate contact 40 to forward-bias the p-n junction of p-confinement layer 18 and n-confinement layer 14 to cause the active layer 16 to emit light 42 from the light emitting area 26. The current is injected substantially parallel to the light emitting diode light emitting area, through the light emitting diode contact 34, the p-contact layer 20, the p-confinement layer 18, the active layer 16 of the individual light emitting area, and then spreads in the n-confinement layer 14 into the substrate 12 and out the substrate contact 40.

The ground or substrate contact is common to all the light emitting areas. However, each light emitting area or light emitting diode element contains a p-n junction that is separately biased through its light emitting diode contact from all the others. Since each light emitting diode contact is positively biased with respect to ground, current flows only from each light emitting diode contact to ground. The electrically isolating regions and the disordered regions prevents any single light emitting diode contact from causing adjacent light emitting areas to emit light. Current between different light emitting diode contacts does not occur because any small potential difference between the addressed light emitting diode contact and a neighboring light emitting diode contact corresponds to a reverse voltage on the neighboring light emitting diode contact.

The light 42 is emitted through the emitter surface area 44 which is substantially perpendicular to the bottom surface 38 of the substrate 12. The emitter surface area 44 is aligned with the light emitting diode light emitting area 26. The light is emitted through the bottom surface 38 of the substrate 12 in an area not metallized to form the substrate contact 40. Hence, light emitting diode array 10 is a surface emitting light emitting diode. The light emitting diode contact 34, aligned with the light emitting area 26 prevents light from being emitted by the light emitting area through the p-side of the light emitting diode array.

The shape of the emitter surface area and the resulting emitted light is determined by the shape of the light emitting diode light emitting areas which can be circular, elliptical, square, parallelogramal, trapezoidal, triangular or any desired shape or size. The emitted light itself can be either continuous wave or pulse.

Typically, the light emitting diode array 10 has an operating current of about 10 milliamperes with an output power of about 30 microwatts per individual light emitting element.

Current is injected between the heater contact 36 and the substrate contact 40 to cause the heater strip 32 to generate heat. The heat generated will equal the voltage times the current or, alternatively, the heat generated will equal the current squared times the resistance of the heater strip.

The current is injected through the heater contact 36, the heater element 32, the n-disordered region 24, and then spreads in the first confinement layer 14 into the substrate 12 and out the substrate contact 40. The substrate or ground contact is common to all the heater strips.

Since each heater contact is positively biased with respect to ground, current flows only from each heater contact to ground. The electrically isolating regions and the disordered regions prevents any single heater contact from causing adjacent heater strips to generate heat or from causing adjacent light emitting diode light emitting areas to emit light.

The symmetrical spacing of the individual heater elements 32 on one side of the corresponding individual light emitting diode light emitting area 26 provides heating for that individual light emitting diode light emitting area. The resistive region 28 of the heater strip 32 have some finite electrical resistance. Heat will thus be generated when a current is run through the heater strip.

Thus, when current is injected through the heater strips 32, heat is generated and spreads out through the n-disordered region 24 to heat the adjacent light emitting diode light emitting area.

As shown in FIG. 3, heater elements 32 have been fabricated adjacent along one side of the light emitting diodes 26 of the thermally stabilized light emitting diode structure array 10. The heater elements run parallel along the length of the array of the light emitting diodes.

When the current is run through the light emitting diode light emitting area to emit light (the light emitting diode is on), the current in the adjacent heater elements is reduced to zero. When the current to the light emitting diode light emitting area is reduced to zero (the light emitting diode is off), a current is run through the adjacent heater elements. The amount of current run through the adjacent heater elements, when no current is run through the light emitting diode light emitting area, is set to be precisely the amount needed to generate sufficient heat to maintain the temperature within the light emitting diode at the same value as it was during emission of light. The temperature will remain constant within the light emitting diode light emitting area, regardless of how long or short a time the light emitting diode is on or how long or short a time the light emitting diode is off. Thus, the light emitting diode light emitting area is held at constant temperature, and the power emitted from the light emitting diode light emitting area remains constant independent of the data.

To maintain the temperature of the active region during a pixel time when the current to the light emitting diode light emitting area is reduced to zero (the light emitting diode is off), the adjacent heater elements need supply only enough energy to replace the heat lost from the light emitting diode light emitting area.

Thus, each individual light emitting diode is maintained at the higher, hotter temperature at which the light emitting diode is emitting light even when the light emitting diode is not emitting light. The temperature is maintained by either the heat generated by the light emitting diode in emission of light or by the heat generated by the adjacent heater element. By maintaining the temperature of the individual light emitting diodes in the array at a constant temperature, the resulting pixel positioning from the light emitting diodes of the array is also constant.

The thickness of the substrate 12 may impede emission of the light from the active layer of the light emitting diode array. To avoid this impediment, the active layer can be made of semiconductor material with a bandgap less than the bandgap of the substrate. Alternatively, the substrate can be removed by etching a trough or stripe (not shown) in the surface of the substrate by standard chemical etching means or other techniques to expose the surface of the first confinement layer to expose the emitter surface areas of the light emitting diodes to facilitate light emission. The exposed surface of the first confinement layer may also be coated with an anti-reflective coating to also facilitate light emission.

The active layer is shallower in the light emitting diode array closer to the light emitting surface. Similarly, the light emitted from the active layer does not pass through a heavily doped contact layer unlike when the individual contacts and the light emitting surface areas are on the same side of the light emitting semiconductor.

Figure 4:
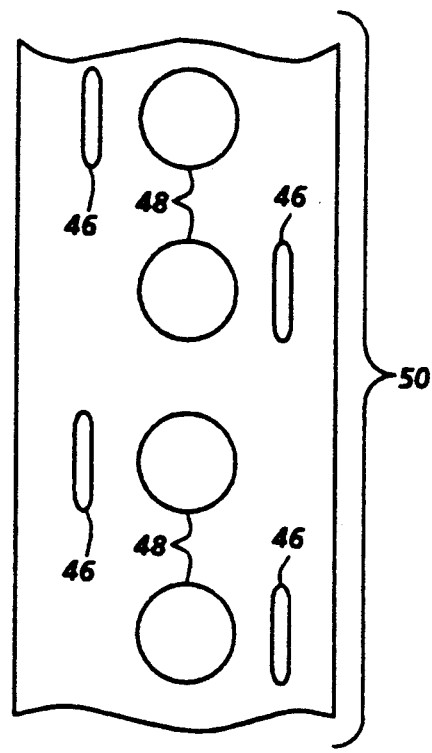
FIG. 4 is a schematic illustration of the top view of an alternative embodiment of the thermally stabilized light emitting diode array structure formed according to the present invention.

The individual heater elements 46 can be formed on alternating sides of the individual light emitting diodes 48 of the array 50 as shown in FIG. 4. The heater elements will alternate on opposite sides along the length of the array of the light emitting diodes.

Figure 5:
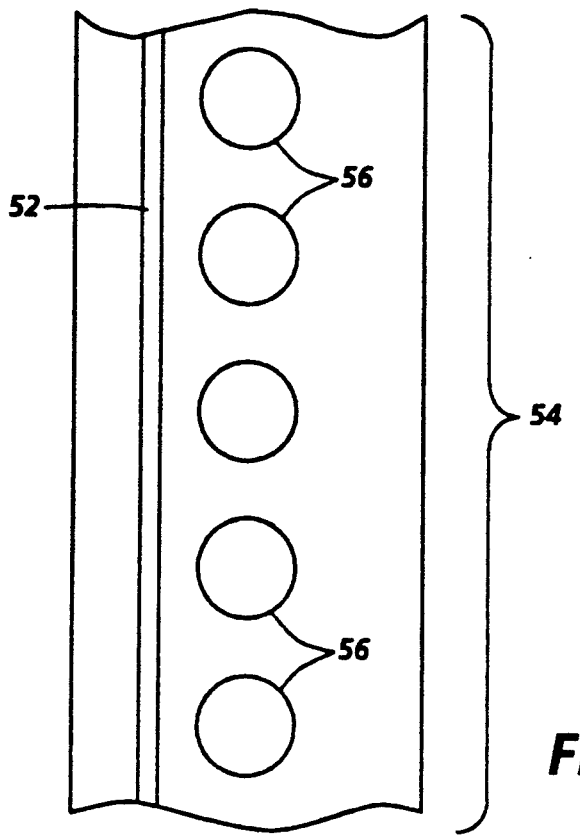
FIG. 5 is a schematic illustration of the top view of another alternate embodiment of the thermally stabilized light emitting diode array structure formed according to the present invention.

A single heater strip 52 can be formed parallel to the array 54 of light emitting diodes 56 as shown in FIG. 5. The heater strip is a single resistive region extending longitudinally along one side of the length of the thermally stabilized light emitting diode array structure 10, along the length of the array of the light emitting diodes.

The single heater strip provides variable heating over the length of the entire array. If all the light emitting diodes are emitting light, the heater strip is not generating heat. If all the light emitting diodes are not emitting light, the heater strip is generating its maximum heat to maintain all the light emitting diodes at the higher operating temperature.

As the number of light emitting diodes emitting light and not emitting light varies, the amount of heat generated by the heater strip will vary to maintain the higher operating temperature for the light emitting diodes not emitting light. The heater strip will provide uniform heating over the entire length of the light emitting diode array to compensate for the light emitting diodes which are not emitting light. Since heat flows to cooler regions, heat generated by the heater strip adjacent to a light emitting diode emitting light will flow to a light emitting diode not emitting light.

Figure 6:
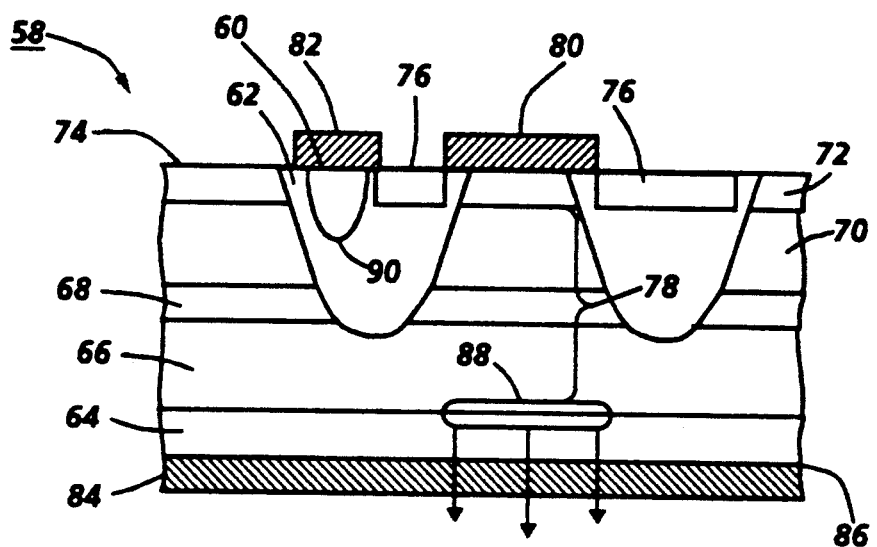
FIG. 6 is a schematic illustration of a cross-sectional side view of another thermally stabilized light emitting diode array structure formed according to the present invention.

In FIG. 6, the thermally stabilized light emitting diode array structure 58 is of identical structure to the thermally stabilized light emitting diode array structure 10 of FIGS. 1, 2 and 3, except that the resistive region 28 of FIGS. 2 and 3 has been replaced with a diffused region 60 in FIG. 5 to form a p-n junction with the disordered region 62. Thus, the thermally stabilized light emitting diode array structure 58 comprises a substrate 64 of n-GaAs upon which is epitaxially deposited a first confinement layer 66 of n-$Al_xGa_{1-x}As$; an active layer 68 of nondoped GaAs for providing light wave generation and propagation, a second confinement layer 70 of p-$Al_yGa_{1-y}As$ where $x=$ or $x \neq y$, and a contact layer 72 of p-GaAs.

N-impurity induced disordered regions 62 are formed in the thermally stabilized light emitting diode array structure 58 extending through portions of the contact layer 72, the second confinement layer 70, the active layer 68 and partially extending through the first confinement layer 66.

Upon completion of the n-impurity induced disordering step, a second $Si_3N_4$ mask is formed on the top surface 74 of the contact layer 72 with openings exposing regions of the light emitting diode array structure to diffusion of impurity atoms into the semiconductor layers. This second mask exposes a narrower region to one side of the n-impurity induced disordered regions 62.

A high concentration p-impurity dopant, such as zinc, will be selectively diffused into the regions of the light emitting diode array structure exposed by the second mask. The diffusion of zinc is accomplished at a relatively low temperature of approximately 650° C. in an evacuated heater, such as a semi-sealed graphite boat, containing appropriate diffusion and arsenic sources and is maintained for a sufficiently long period of time, e.g. approximately one hour, to partially penetrate the n-impurity induced disordered region 62 to form the p-diffused region 60 for a one micron deep diffusion. The p-diffused regions 60 are entirely within the n-disordered regions 62.

Other p-impurity dopants such as Be and Mg do not diffuse as fast as zinc through various layers. This may be an advantage allowing for better control of the depth to which the p-impurity dopant will diffuse down. The diffusion step can occur near completion of the disordering step is complete in order to avoid additional disordering during p diffusion. The diffusion step is only type conversion of the disordered region from n to p.

Electrical isolating regions 76 are formed in the n-disordered regions 62 through the top surface 74, adjacent to the p-disordered regions 60.

Between the n-disordered regions 62 in the thermally stabilized light emitting diode array structure 58 are the light emitting diode light emitting areas 78 consisting of the nondisordered sections of the second confinement layer 70, the active layer 68 and the first confinement layer 66.

Light emitting diode contacts 80 are formed on the top surface 74, aligned with each light emitting diode 78. Heater contacts 82 are formed on the top surface of the p-diffused region 60, aligned with each p-diffused region. The electrically isolating regions 76 electrically and physically isolate the adjacent light emitting diode and heater contacts. A substrate contact 84 is formed on a portion of the bottom surface 86 of the substrate 64.

Current is injected between the light emitting diode contact 80 and the substrate contact 84 in the light emitting diode 78 to forward-bias the p-n junction of the second confinement layer 70 and the first confinement layer 66 to cause the active layer 68 to emit a beam of light 80 through the emitter surface area 88 through the bottom surface 86 of the substrate 64. The nondisordered second confinement layer of p-$Al_yGa_{1-y}As$ is the p-confinement layer and the nondisordered first confinement layer of n-$Al_xGa_{1-x}As$ is the n-confinement layer of the p-n junction.

The current is injected through the light emitting diode contact 80, the nondisordered section of the contact layer 72, the nondisordered section of the second confinement layer 70, the nondisordered section of the active layer 68 of the individual light emitting diode, and then spreads in the nondisordered section of the first confinement layer 66 into the substrate 64 and out the substrate contact 84. The substrate or ground contact is common to all the light emitting diodes.

Current is injected between the heater contact 82 and the substrate contact 84 to forward-bias the p-n junction of the second disordered region 60 and the first disordered region 62 to generate heat. The p-n junction between the p-diffused region 60 and the n-disordered region 62 constitute a heater element 90.

The current is injected through the heater contact 82, the p-diffused region 60, the n-disordered region 62, and then spreads in the first confinement layer 66 into the substrate 64 and out the substrate contact 84. The substrate or ground contact is common to all the heater elements.

As with the thermally stabilized light emitting diode array structure 10 of FIGS. 1, 2 and 3, when current is injected through the p-n junction of the heater elements, heat is generated and spreads through the n-disordered regions 52.

For the GaAs/AlGaAs semiconductor structure of this thermally stabilized light emitting diode array structure, the resulting p-n junction is formed in AlGaAs with Al composition high enough to make it indirect. The indirect material is especially advantageous in the case because virtually all the current passed through this junction generates heat. Indirect means the band to band transitions occur only nonradiatively, i.e. no light is emitted spontaneously. Therefore all electrons and holes recombine by giving up their energy in the form of heat without radiating light.

To reduce the time delay between the onset of the heater element current and warming of the active region of the light emitting diode, the source of the heat should be as close to the active region as possible. This also minimizes the amount of semiconductor material that must be kept warm. Thus, the p-n junction is advantageous compared to the resistive region since the junction, where the heat is generated is below the surface and therefore closer to the light emitting diodes.

The individual p-n junction heater elements of the thermally stabilized light emitting diode array structure can be formed on the same side of the individual light emitting diodes of the array as with the resistive region heater element shown in FIG. 3. The heater elements will extend along the length of the array of the light emitting diodes.

The individual p-n junction heater elements of the thermally stabilized light emitting diode array structure can be formed on the alternating sides of the individual light emitting diodes of the array as with the resistive region heater element shown in FIG. 4. The heater elements will alternate on opposite sides along the length of the array of the light emitting diodes.

A single p-n junction heater strip of the thermally stabilized light emitting diode array structure can be formed parallel to the array of light emitting diodes as with the resistive region heater element shown in FIG. 5. The p-n junction heater strip is a single p-n junction extending longitudinally along the length of the thermally stabilized light emitting diode array structure, along the length of the array of the light emitting diodes.

Figure 7:
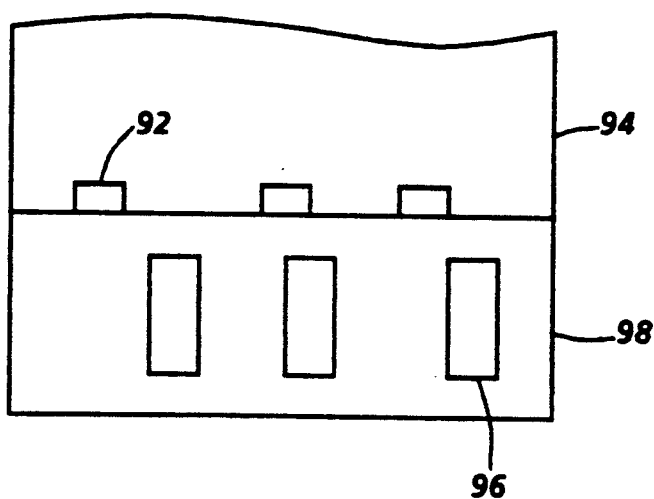
FIG. 7 is a schematic illustration of a cross-sectional side view of another thermally stabilized light emitting diode array structure formed according to the present invention.

Alternately, as shown in FIG. 7, the heater element 92, either a restive region or a p-n junction, either on one side or alternating sides, either an array of individual heater elements or a single heater strip, can be formed on a substrate 94, which is in thermal contact with the light emitting diodes 96 in an array on a separate substrate 98.

The light emitting diode light emitting area of a light emitting diode array structure has a threshold or minimum operating temperature for light wave generation and propagation which must be generated within the light emitting diode light emitting area. A heater strip or adjacent heater strips cannot be used to reach the threshold operating temperature. However, once past that minimum temperature, the heater strip can be used to maintain the temperature of the light emitting diode light emitting area of a light emitting diode array structure at the transient times or within a pulse fluctuations in temperature.

Once above the threshold operating temperatures, the light emitting diode light emitting area of a thermally stabilized light emitting diode array structure may be cooled by the emission of light. This heat loss may be balanced by the heat produced from the adjacent heater strips. Thus, current may be injected through the heater strips, even when current is being injected through the light emitting diode light emitting area, to produce the minimal amount of heat from the heater strips to offset the heat loss from emission of light from the light emitting diode light emitting area. Cooling occurs only if the light emitting diode is heated above its operating temperature at the operating power.

The light emitting diode array structure thermally stabilized by the present invention is not restricted to the surface emitter embodiments discussed but would include others known to those of ordinary skill in the art. The heater elements can also be on the surface from which the light is emitted, in addition to the heater elements being on the opposing surface from which the light is emitted as discussed.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A thermally stabilized light emitting diode array structure comprising:
    an array of a plurality of light emitting diodes, on a single substrate,
    plurality of heater elements, corresponding and adjacent to each of said light emitting diodes when said light emitting diodes are not emitting light such that heat generated from said adjacent heater elements is used to maintain a constant temperature within said light emitting diodes.

2. The thermally stabilized light emitting diode array structure of claim 1 wherein said heater elements are resistive regions.

3. The thermally stabilized light emitting diode array structure of claim 1 wherein said heater elements are p-n junctions.

4. The thermally stabilized light emitting diode array structure of claim 1 wherein adjacent heater elements alternate on opposite sides of said array of a plurality of light emitting diodes.

5. The thermally stabilized light emitting diode array structure of claim 1 wherein said heater elements are on a separate substrate in thermal contact with said array of a plurality of light emitting diodes on a single substrate.

6. A thermally stabilized light emitting diode array structure comprising:
    an array of a plurality of light emitting diodes on a single substrate,
    a heater strip adjacent to each of said light emitting diodes when said light emitting diodes are not emitting light such that heat generated from said adjacent heater strip is used to maintain a constant temperature within said light emitting diodes.

7. The thermally stabilized light emitting diode array structure of claim 6 wherein said heater strip is a resistive region.

8. The thermally stabilized light emitting diode array structure of claim 6 wherein said heater strip is a p-n junction.

9. The thermally stabilized light emitting diode array structure of claim 6 wherein said heater strip is on a separate substrate in thermal contact with said array of a plurality of light emitting diodes on a single substrate.

* * * * *